US010832835B2

(12) United States Patent
Doolittle et al.

(10) Patent No.: US 10,832,835 B2
(45) Date of Patent: Nov. 10, 2020

(54) ADAPTIVE MANUFACTURING TABLE

(71) Applicant: Safran Seats USA LLC, Gainesville, TX (US)

(72) Inventors: Travis D. Doolittle, Little Elm, TX (US); Daniel Garcia, Denton, TX (US); Matthew D. Oliver, Gainesville, TX (US); Andrew J. Baker, Marietta, OK (US)

(73) Assignee: Safran Seats USA LLC, Gainesville, TX (US)

( * ) Notice: Subject to any disclaimer, the term of this patent is extended or adjusted under 35 U.S.C. 154(b) by 779 days.

(21) Appl. No.: 14/907,090

(22) PCT Filed: Jul. 22, 2014

(86) PCT No.: PCT/US2014/047534
§ 371 (c)(1),
(2) Date: Jan. 22, 2016

(87) PCT Pub. No.: WO2015/013232
PCT Pub. Date: Jan. 29, 2015

(65) Prior Publication Data
US 2016/0155544 A1    Jun. 2, 2016

Related U.S. Application Data

(60) Provisional application No. 61/857,309, filed on Jul. 23, 2013.

(51) Int. Cl.
*H01B 13/012* (2006.01)
*H05K 13/00* (2006.01)
(Continued)

(52) U.S. Cl.
CPC ......... *H01B 13/01227* (2013.01); *B25H 1/16* (2013.01); *B25H 1/18* (2013.01); *G03B 21/145* (2013.01); *H05K 13/0053* (2013.01)

(58) Field of Classification Search
CPC ...... H01B 13/01227; B25H 1/16; B25H 1/18; G03B 21/10
See application file for complete search history.

(56) References Cited

U.S. PATENT DOCUMENTS 2,805,471 A  *  9/1957  Lowden ........... H01B 13/01227
                                              174/72 A
4,359,070 A  *  11/1982  Hidassy ............... B65B 13/027
                                              140/123.6
(Continued)

FOREIGN PATENT DOCUMENTS

DE       9312020       10/1993
DE       10320557      12/2004
(Continued)

OTHER PUBLICATIONS

International Patent Application No. PCT/US2014/047534, Invitation to Pay Additional Fees and, Where Applicable, Protest Fee dated Sep. 5, 2014.
(Continued)

*Primary Examiner* — Livius R. Cazan
(74) *Attorney, Agent, or Firm* — Kilpatrick Townsend & Stockton LLP

(57) ABSTRACT

Described is an adaptive manufacturing table (100) including a structural frame assembly (300), a moveable table assembly (400) including a table surface (130), and a projector (101) such that the projector (101) is rigidly mounted to the structural frame assembly (300). The projector (101) may be configured to directly project an image onto the table surface (130).

23 Claims, 8 Drawing Sheets

(51) Int. Cl.
*B25H 1/16* (2006.01)
*B25H 1/18* (2006.01)
*G03B 21/14* (2006.01)

(56) References Cited

U.S. PATENT DOCUMENTS

| | | | | |
|---|---|---|---|---|
| 4,979,544 | A | 12/1990 | Swindlehurst | |
| 6,019,484 | A * | 2/2000 | Seyler | F21L 14/04 362/287 |
| 6,604,829 | B2 * | 8/2003 | Rodriguez, Jr. | G03B 21/10 348/E5.137 |
| 8,066,383 | B2 | 11/2011 | Lin | |
| 2008/0054154 | A1 * | 3/2008 | Lin | H01R 43/28 248/693 |
| 2009/0265923 | A1 * | 10/2009 | MaClean | H01B 13/01227 29/729 |
| 2010/0188642 | A1 * | 7/2010 | Falendysz | G03B 21/14 353/79 |

FOREIGN PATENT DOCUMENTS

| | | | |
|---|---|---|---|
| DE | 102004010176 | 9/2005 | |
| JP | 2003012285 A * | 1/2003 | ............... B25H 1/16 |
| KR | 20050079909 A * | 8/2005 | |

OTHER PUBLICATIONS

International Patent Application No. PCT/US2014/047534, Search Report and Written Opinion dated Nov. 28, 2014.
"Table-Mounted Slide Enlarger to Inspect Printed Circuit Card Assemblies for Missing Components", IBM Technical Disclosure Bulletin, International Business Machines Corp., Thornwood, United States, vol. 33, No. 7, Dec. 1990, p. 41/42, XP000108406, ISSN: 0018-8689.
International Patent Application No. PCT/US2014/047534, International Preliminary Report on Patentability dated Feb. 4, 2016.
Mexico Patent Application No. MX/a/2016/000850, Office Action, dated Jul. 10, 2019.

* cited by examiner

ADAPTIVE MANUFACTURING TABLE

CROSS REFERENCE TO RELATED APPLICATIONS

This application is the U.S. national phase entry of International Patent Application Serial No. PCT/US2014/047534 ("the '534 application"), filed on Jul. 22, 2014, which application is related to and claims priority benefits from U.S. Provisional Application Ser. No. 61/857,309 ("the '309 application"), filed on Jul. 23, 2013, entitled ADAPTIVE WIRE HARNESS BOARD. The '534 and '309 applications are hereby incorporated in their entireties by this reference.

FIELD OF THE INVENTION

The field of the invention relates to fixtures and processes for assembling and manufacturing wire harnesses.

BACKGROUND

Many vehicles such as passenger aircraft, automobiles, buses, trains and the like require significant amounts of wiring for subsystems and components. For example, many modern vehicles utilize an increased number of integral electronic components due to safety and entertainment systems and an associated plurality of configurations based on customer requirements. Accordingly, manufacturing processes for these vehicles and their subcomponents and systems require an increasing number of wire harnesses and wire harness configurations. In many instances, a manufacturer may have hundreds of wire harness configurations such that each configuration includes an individualized drawing to be used during the assembly/manufacturing process. Traditionally, such drawings were hand drawn (i.e., hard copies) such as ink on mylar. However, many industries are implementing "paperless" initiatives that rely on digital Computer Aided Design (CAD) drawings for various reasons (i.e., ease of communication and collaboration over distance, consistency, repeatability, storage space and associated costs). However, certain assembly/manufacturing tasks (such as building wire harnesses) still require an interface with a representation of drawing data at a known scale. Constructing wire harnesses is often completed at a large table with pegs attached to the surface of the table for assisting in arranging the relevant wiring with a paper copy of the associated drawing (whether ink on mylar or a printed copy of a digital drawing). It is possible to build individualized tables for each harness configuration; however, the number of permutations of harness configurations may often be prohibitive.

As an example, U.S. Pat. No. 8,066,383 describes a wire harness projection system including two separate elements, namely, a rack 20 and a work bench 22, which are physically isolated from one another to reduce vibrations transmitted from work bench 22 to projector 16 (which is attached to rack 20). Projector 16 is configured to project an image I via mirror 18 onto work bench 22. Because the projector 16 is mounted independently from work bench 22, there is an intricate calibration process that must be repeated each time work bench 22 moves relative to rack 20.

In certain situations, it may be desirable to project an image of a digital drawing onto the surface of a table assembly to facilitate manufacturing tasks using a projector that is rigidly mounted to the table assembly so as to avoid unnecessary calibration procedures.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

According to certain embodiments of the present invention, an adaptive manufacturing table comprises a structural frame assembly, a moveable table assembly comprising a table surface, and a projector such that the projector is rigidly mounted to the structural frame assembly. The projector, in some embodiments, is configured to directly project an image onto the table surface.

In some embodiments, the adaptive manufacturing table further comprises one or more mechanisms for moving the table assembly. The one or more mechanisms for moving the table assembly, in certain embodiments, comprise a motor and a chain drive mechanism.

The moveable table assembly of the adaptive manufacturing table, in certain embodiments, is configured to rotate and to translate. In some embodiments, the moveable table assembly is configured to rotate about a horizontal axis and to translate in a vertical direction. The moveable table assembly, in certain embodiments, is configured to rotate between a flat position at approximately 0 degrees to approximately 70 degrees. The adaptive manufacturing table, in some embodiments, further comprises a movable planar assembly disposed under the moveable table assembly wherein the movable planar assembly is configured to translate in a vertical direction.

In some embodiments, the projector is a short throw projector.

The adaptive manufacturing table, in some embodiments, further comprises an automatic cable tie device.

The table surface of the adaptive manufacturing table, in certain embodiments, further comprises a plurality of holes.

In some embodiments, the projector is secured by a projector frame portion. The projector frame portion, in certain embodiments, is attached to the structural frame assembly using one or more hinges such that the projector frame portion is configured to rotate.

In certain embodiments of the present invention, the adaptive manufacturing table further comprises a shelf assembly.

According to certain embodiments of the present invention, an adaptive manufacturing table comprises a moveable table assembly and a projector mounted to a projector frame. The moveable table assembly may comprise a table surface, a table frame disposed adjacent to the table surface, and a lower working surface disposed on a forward side of the table surface. Further, the moveable table assembly may rigidly interface with the projector frame.

In some embodiments, the projector is configured to directly project an image onto the table surface.

In certain embodiments, the moveable table assembly is configured to rotate and to translate.

According to certain embodiments of the present invention, an adaptive manufacturing table comprises a moveable table assembly comprising a table surface comprising a plurality of holes and a projector such that the projector is rigidly mounted to the moveable table assembly.

In some embodiments, the projector is configured to directly project an image onto the table surface.

In certain embodiments, the moveable table assembly is configured to rotate and to translate.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

FIGS. 1-8 illustrate embodiments of an adaptive manufacturing table 100. In these embodiments, the adaptive manufacturing table 100 comprises a structural frame assembly 300, a moveable table assembly that includes a table surface 130, and a projector 101 such that the projector 101 is rigidly mounted to the structural frame assembly 300. The structural frame assembly 300 may include a plurality of structural members configured to move table surface 130 in one or more directions.

Structural Frame Assembly

Figure 1:
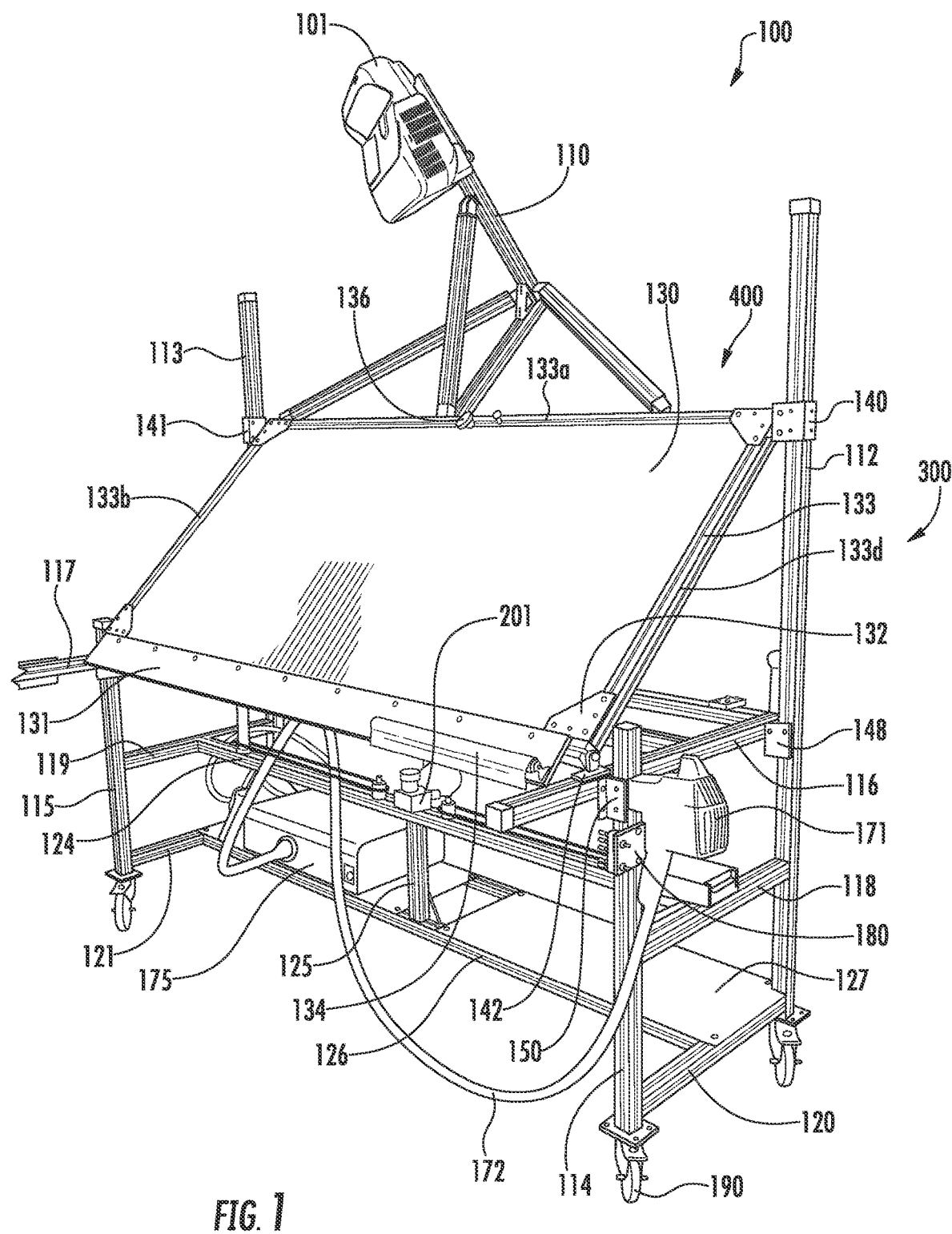
FIG. 1 is a front right perspective view of an adaptive manufacturing table according to certain embodiments of the present invention.
Figure 2:
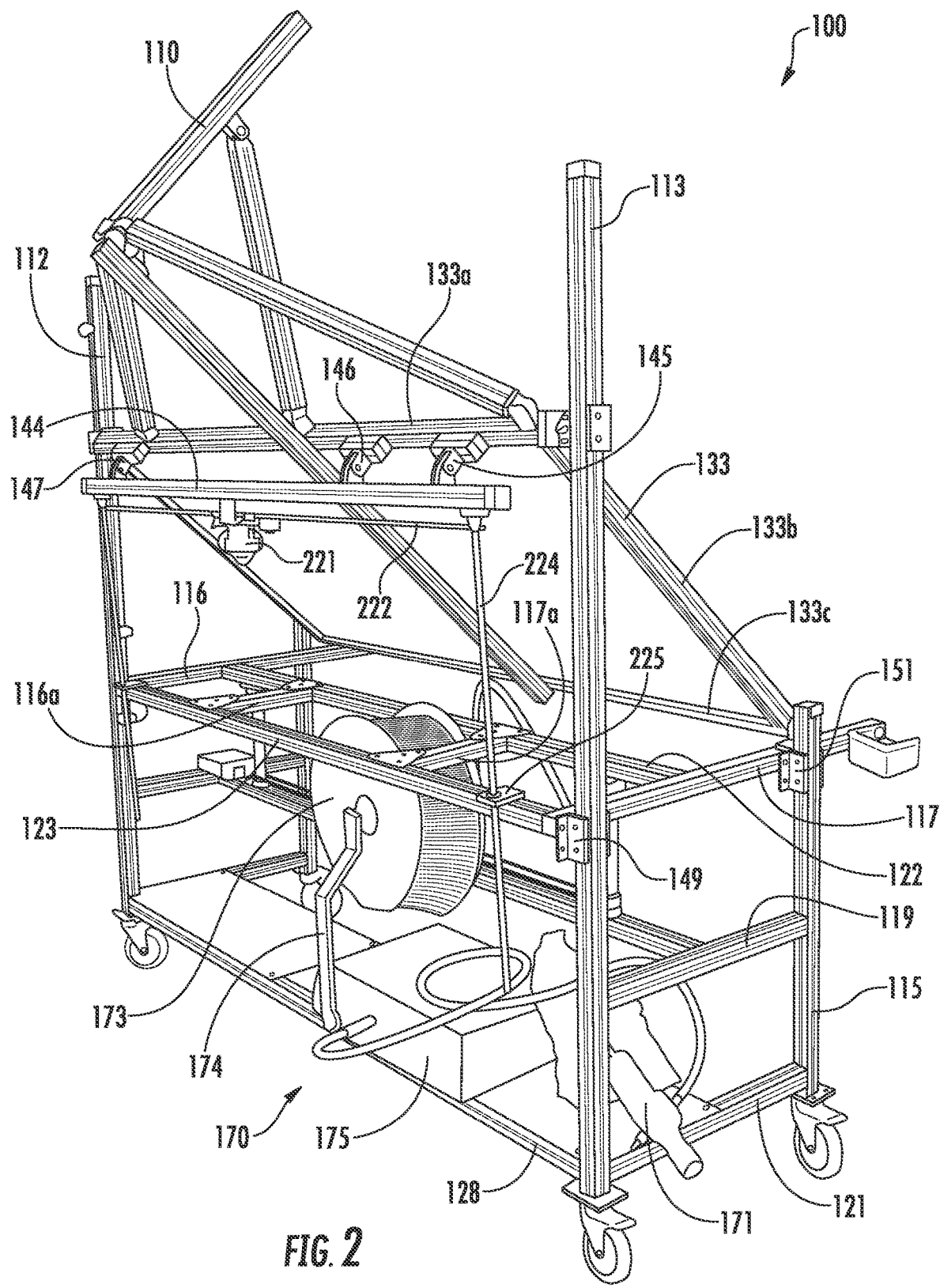
FIG. 2 is a rear left perspective view of the adaptive manufacturing table of FIG. 1.
Figure 3:
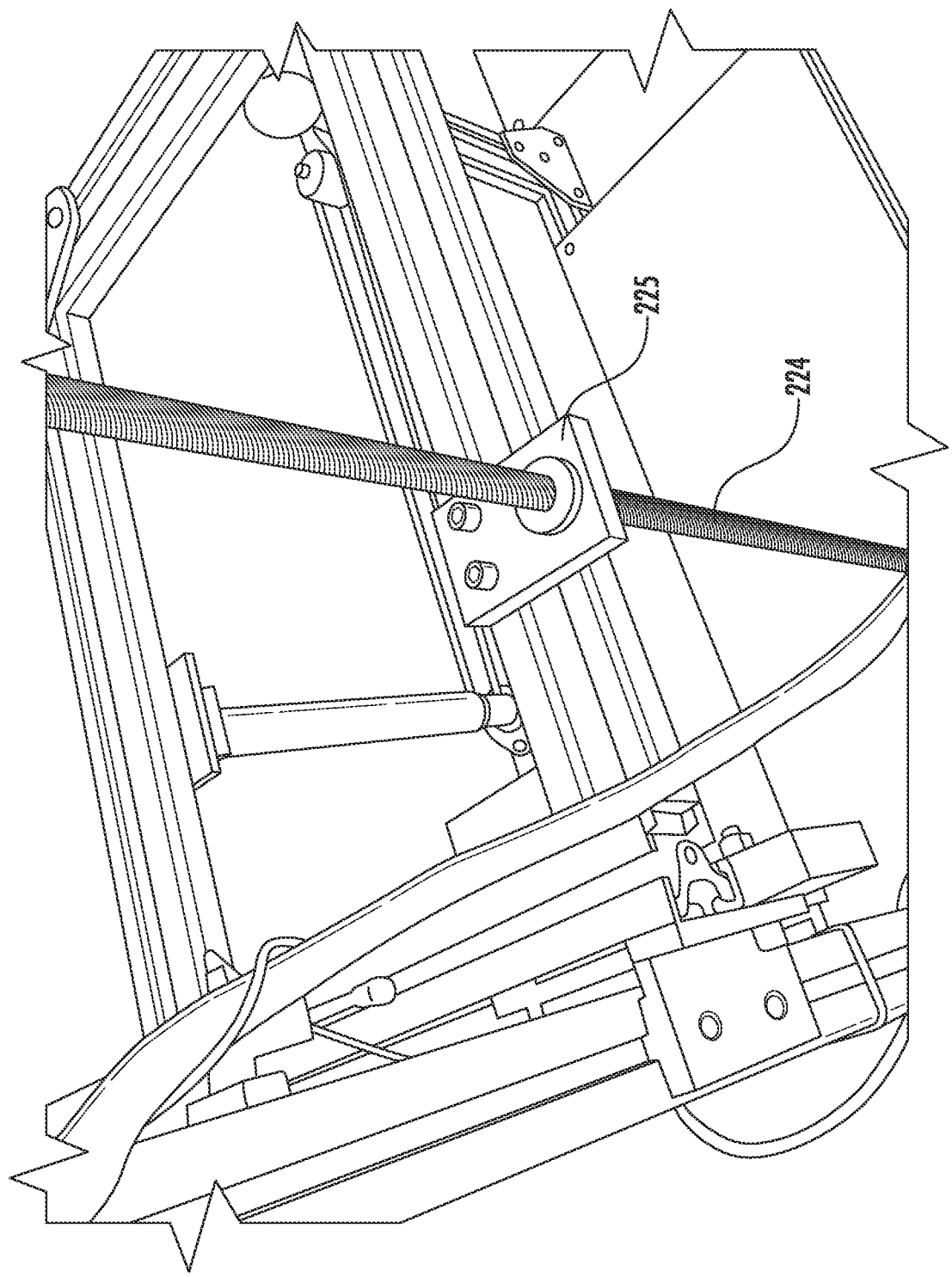
FIG. 3 is a perspective view of a portion of a mechanism for changing the angle of the moveable table assembly of the adaptive manufacturing table of FIG. 1.

As shown in FIGS. 1 and 2, in some embodiments, the structural frame assembly 300 includes four vertical corner members including rear right member 112, rear left member 113, front right member 114, and front left member 115. The corner members interface with a movable planar assembly that includes right edge member 116, right partial member 116a, left edge member 117, left partial member 117a, intermediate horizontal member 122, and rear horizontal member 123. The movable planar assembly interfaces with rear right member 112 through sliding fitting 148, interfaces with rear left member 113 through sliding fitting 149, interfaces with front right member 114 through sliding fitting 150, and interfaces with front left member 115 through sliding fitting 151.

The movable planar assembly secures the front section of the table assembly (adjacent to a user) using sliding brackets 142 and 143. In particular, sliding bracket 142 is slidably attached to the upper surface of right edge member 116 and sliding bracket 143 is slidably attached to the upper surface of left edge member 117. Sliding bracket 142 is pivotally attached to the table assembly (described in more detail below) at the intersection of front frame portion 133c and right frame portion 133d. Sliding bracket 143 is pivotally attached to the table assembly at the intersection of left frame portion 133b and front frame portion 133c. The rear section of the table assembly is attached to rear right member 112 and rear left member 113 using sliding brackets 140 and 141, respectively. Sliding bracket 140 is configured to slide along the length of rear right member 112 while sliding bracket 141 is configured to slide along the length of rear left member 113. Moreover, sliding bracket 140 is pivotally attached to the table assembly at the intersection of rear frame portion 133a and right frame portion 133d. Sliding bracket 141 is pivotally attached to the table assembly at the intersection of rear frame portion 133a and left frame portion 133b.

To provide lateral support, the structural frame assembly 300 may include horizontal support member 124, which is disposed approximately halfway between the rear vertical supports (rear right member 112 and rear left member 113) and the front vertical supports (front right member 114 and front left member 115). The right hand end of horizontal support member 124 is attached to middle side support member 118. The left hand end of horizontal support member 124 is attached to middle side support member 119. At approximately the center of horizontal support member 124, vertical partial support member 125 is attached and extends downward.

The lower end of vertical partial support member 125 is attached to lower horizontal support member 126. Lower horizontal support member 126 is disposed approximately halfway between the rear vertical supports (rear right member 112 and rear left member 113) and the front vertical supports (front right member 114 and front left member 115). The right hand end of lower horizontal support member 126 is attached to lower right side support member 120. The left hand end of lower horizontal support member 126 is attached to lower left side support member 121.

Lower horizontal support member 126, lower right side support member 120, and lower left side support member 121 along with lower rear support member 128 form a shelf assembly to support one or more shelf surfaces 127.

The structural frame assembly 300 may include one or more casters/wheels 190. As shown in FIG. 1, in some embodiments, the structural frame assembly 300 includes four wheels 190 located at each of the lower four corners where the lower four corners are: the intersection of rear right member 112, lower right side support member 120, and lower rear support member 128; the intersection of rear left member 113, lower left side support member 121, and lower rear support member 128; the intersection of front right member 114 and lower right side support member 120; and the intersection of front left member 115 and lower left side support member 121. Although four wheels 190 are shown in the lower corners as described above, any number of wheels 190 (including more than four and less than four) may be located anywhere to ensure mobility of the adaptive manufacturing table 100 (e.g., anywhere on lower right side support member 120, lower left side support member 121, or lower rear support member 128). In some embodiments, one or more of the wheels 190 may be locked.

The components of the structural frame assembly 300 may be formed of materials including, but not limited to, a steel, aluminum, stainless steel, other metallic materials, composite materials, plastic, thermoplastic, or other similar materials. Moreover, the components of the structural frame assembly 300 may be attached to one another via suitable fasteners, which include, but are not limited to, screws, bolts, rivets or other mechanical or chemical fasteners.

Moveable Table Assembly

The moveable table assembly 400 may include a table surface 130, table frame 133, and a lower working surface 131. The table frame 133 may include rear frame portion 133a, left frame portion 133b, front frame portion 133c, and right frame portion 133d. In some embodiments, the table frame 133 may further include a plurality of corner gusset plates 132, which may be configured to provide rigidity to table frame 133. As described above and as illustrated in FIGS. 1 and 2, the front section of the table assembly 400 is configured to slide forward/aft along right edge member 116 and left edge member 117 using sliding brackets 142 and 143, respectively. In addition, the rear section of the table assembly 400 is configured to slide up/down along rear right member 112 and rear left member 113 using sliding brackets 140 and 141, respectively.

Figure 7:
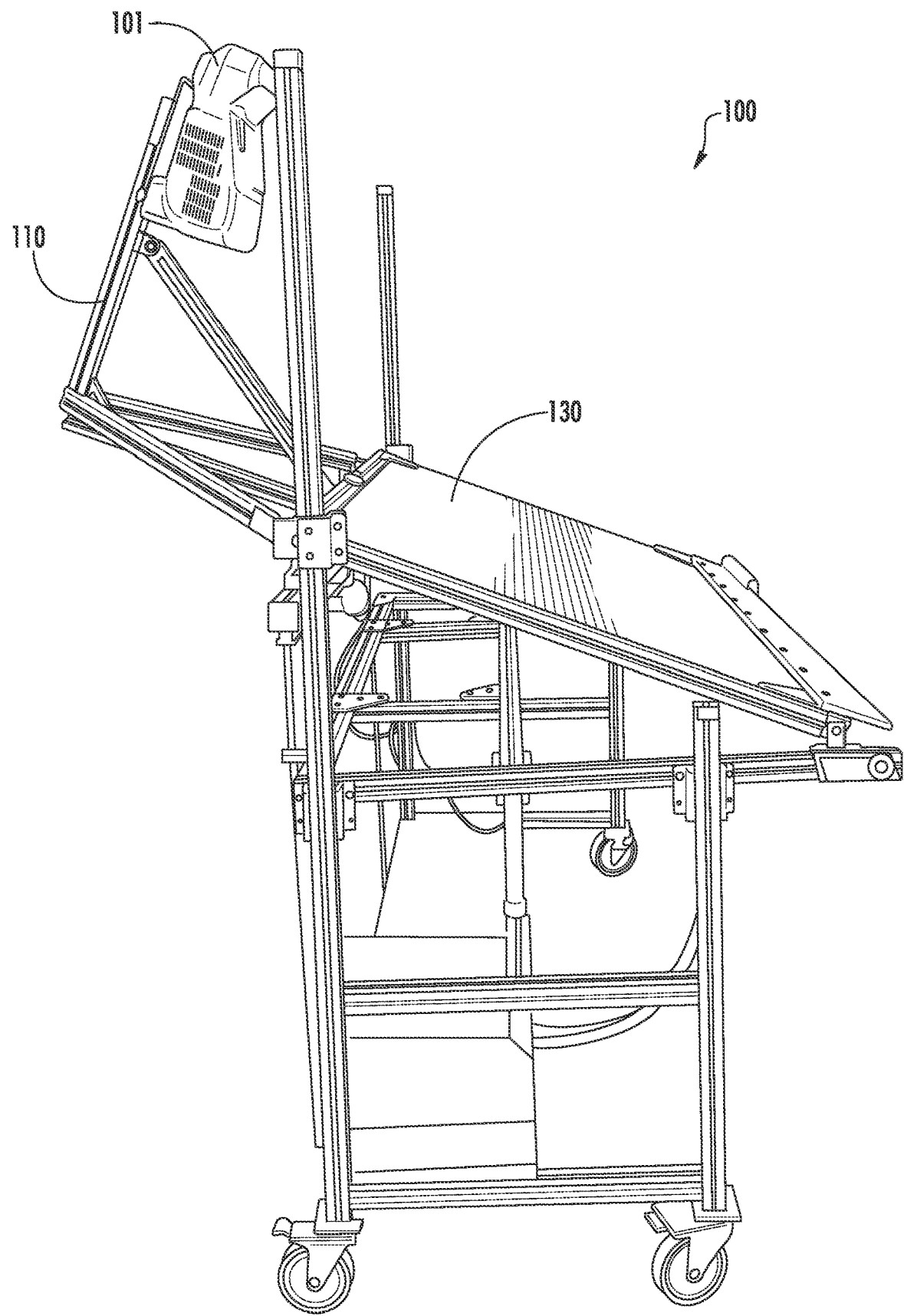
FIG. 7 is a side view of the adaptive manufacturing table of FIG. 1 with the projector frame portion in a rotated position.
Figure 8:
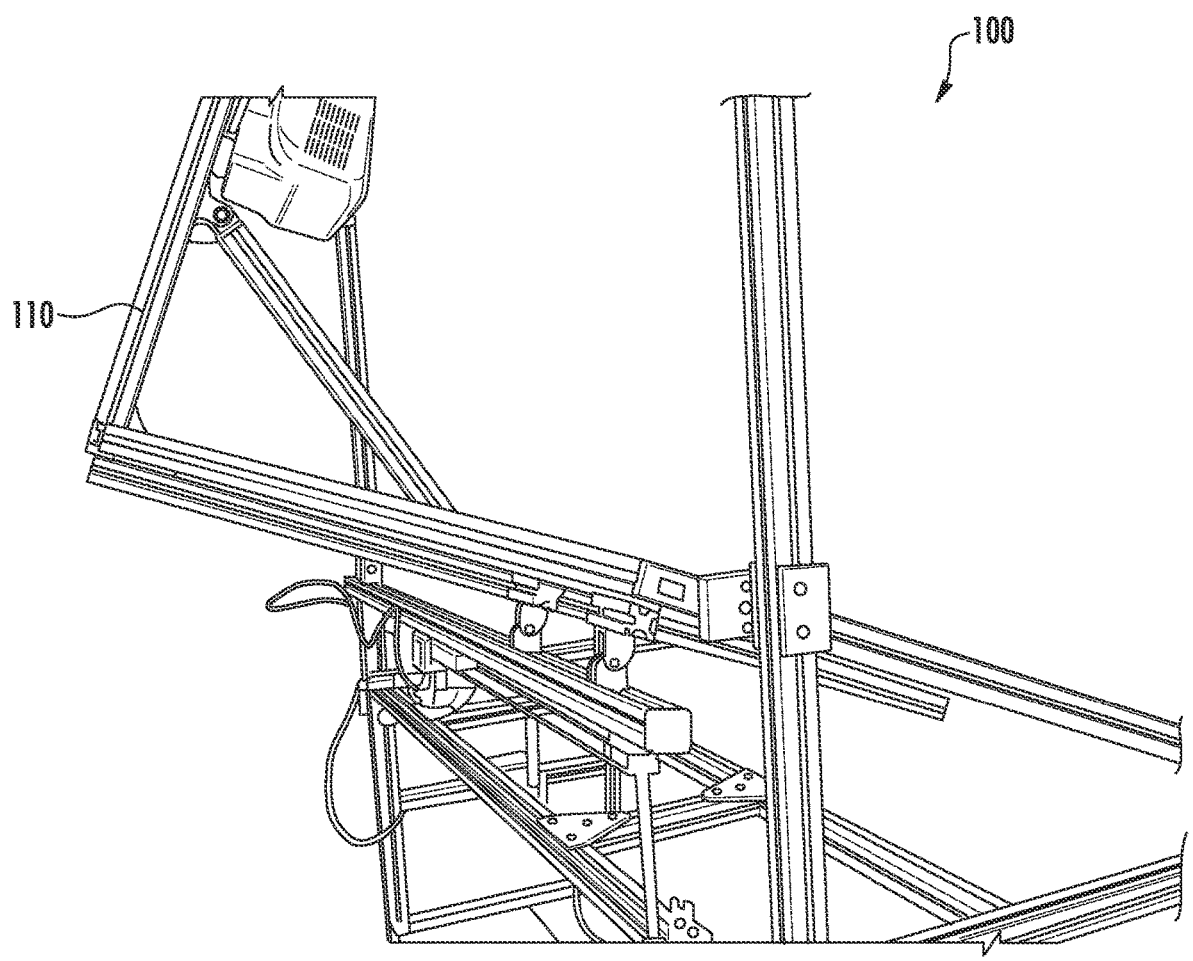
FIG. 8 is a rear left perspective view of the adaptive manufacturing table of FIG. 1 with the projector frame portion in a rotated position.

The rear section of the table assembly 400 also interfaces with projector frame portion 110, which secures projector 101. As shown in FIGS. 1 and 2, in some embodiments, projector frame portion 110 includes five structural members and attaches at three locations to rear frame portion 133a. These three attachment locations may include static mounts or, as illustrated in FIGS. 7 and 8, the three mounts may include coaxial hinges such that the projector frame portion 110 is configured to rotate rearward. Such a rotation facilitates access to the projector for various tasks such as service, maintenance, removal, etc.

Because the projector 101 is mounted directly to the moveable table assembly 400 and moves with the table assembly 400, the projector 101 does not need to be adjusted or calibrated based on relocation or adjustment of the moveable table assembly 400. The projector 101 may be configured to directly project an image onto the table surface 130. In some embodiments, the projector 101 is a short throw projector. The projector 101 may be disposed in close proximity to the table surface 130 such that a high resolution image may be produced over a large portion of the table (in some embodiments, approximately 100% of the surface area of table surface 130).

In certain embodiments, the projector uses a wireless signal (e.g., WIFI) to interface with a network for accessing files and transmitting input signals from the adaptive manufacturing table 100.

Figure 5:
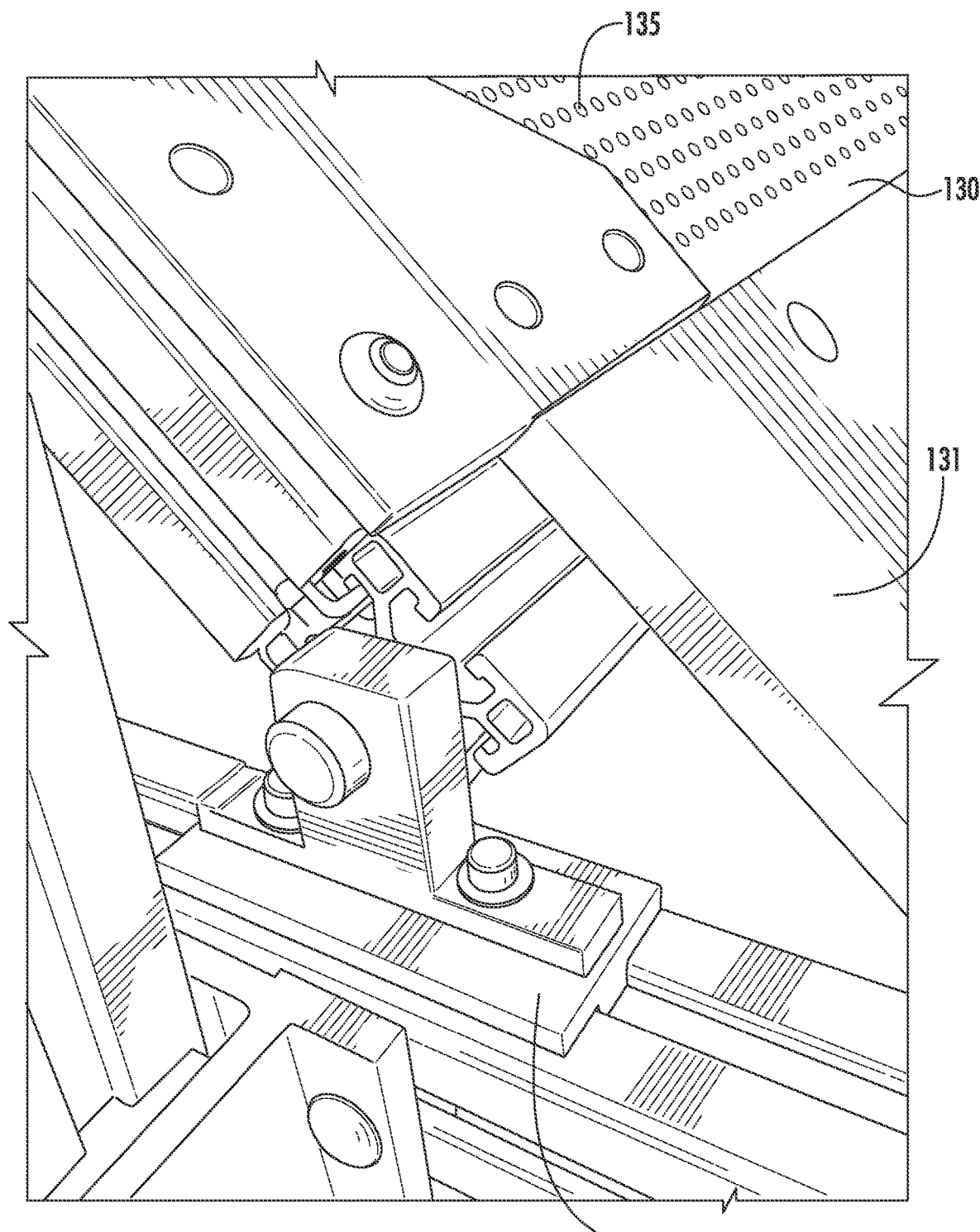
FIG. 5 is a perspective view of a sliding fitting of the deployment apparatus of the adaptive manufacturing table of FIG. 1.
Figure 6:
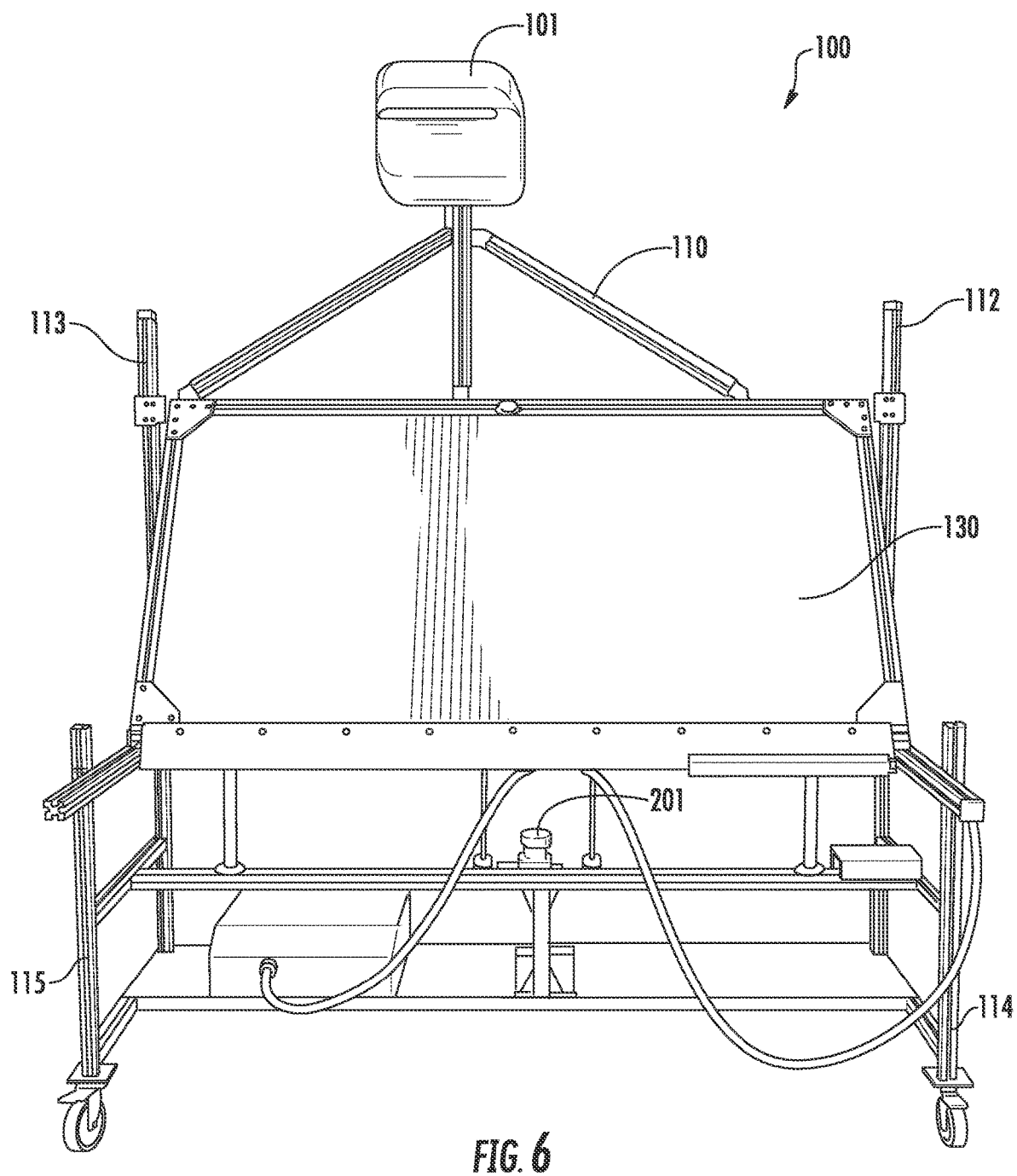
FIG. 6 is a front view of the adaptive manufacturing table of FIG. 1.

As shown in FIG. 5, table surface 130 may include a plurality of holes 135. In some embodiments, holes 135 are ¼" diameter holes that are perpendicular to table surface 130 and are disposed in a one square inch grid pattern. In some embodiments, the table surface 130 is approximately 37.5 inches×74.5 inches. In certain embodiments, table surface 130 includes approximately 26,000 holes 135, but may include as few as 1000 holes, and as many as 100,000 holes. Drop-in pegs may be inserted into the holes 135 where the pegs are configured for facilitating various arrangements on the table surface 130.

The lower working surface 131 is disposed adjacent to a user to provide a flat surface without holes. In some embodiments, the lower working surface 131 is disposed to correspond to a portion of the projected image from projector 101. For example, projector 101 may project interactive (or non-interactive) images such as toolbars, graphical icons, dialog boxes, data entry windows, or any other image (e.g., as part of a graphical user interface or GUI). The smooth surface of lower working surface 131 facilitates visualization of detailed images projected from projector 101. Similarly, a roll unit 134 includes material that can be unrolled, extended along table surface 130 and attached to the table surface 130 (e.g., using a hole 135). Thus, a user may deploy roll unit 134 to view detailed images on the table surface 130.

The moveable table assembly 400 may include an input device configured to facilitate interaction with the images projected by projector 101 (i.e., for providing input commands). One example of an input device, as illustrated in FIG. 1 is pen 136. In some embodiments, an input device may not be necessary as input commands may be detected in other ways, such as motion detection of a user's hand.

The components of the moveable table assembly 400 may be formed of materials including, but not limited to, a steel, aluminum, stainless steel, other metallic materials, composite materials, plastic, thermoplastic, or other similar materials. In some embodiments, table surface 130 comprises Lexan. Moreover, the components of the moveable table assembly 400 may be attached to one another via suitable fasteners, which include, but are not limited to, screws, bolts, rivets or other mechanical or chemical fasteners.

Mechanisms for Moving the Table Assembly

The adaptive manufacturing table 100 may include one or more mechanisms for repositioning the moveable table assembly 400. The one or more mechanisms for moving the table assembly 400 may utilize any suitable device such as electrical motors or actuators, manual operation, pneumatic actuators, hydraulic actuators, or any other suitable device.

Figure 4:
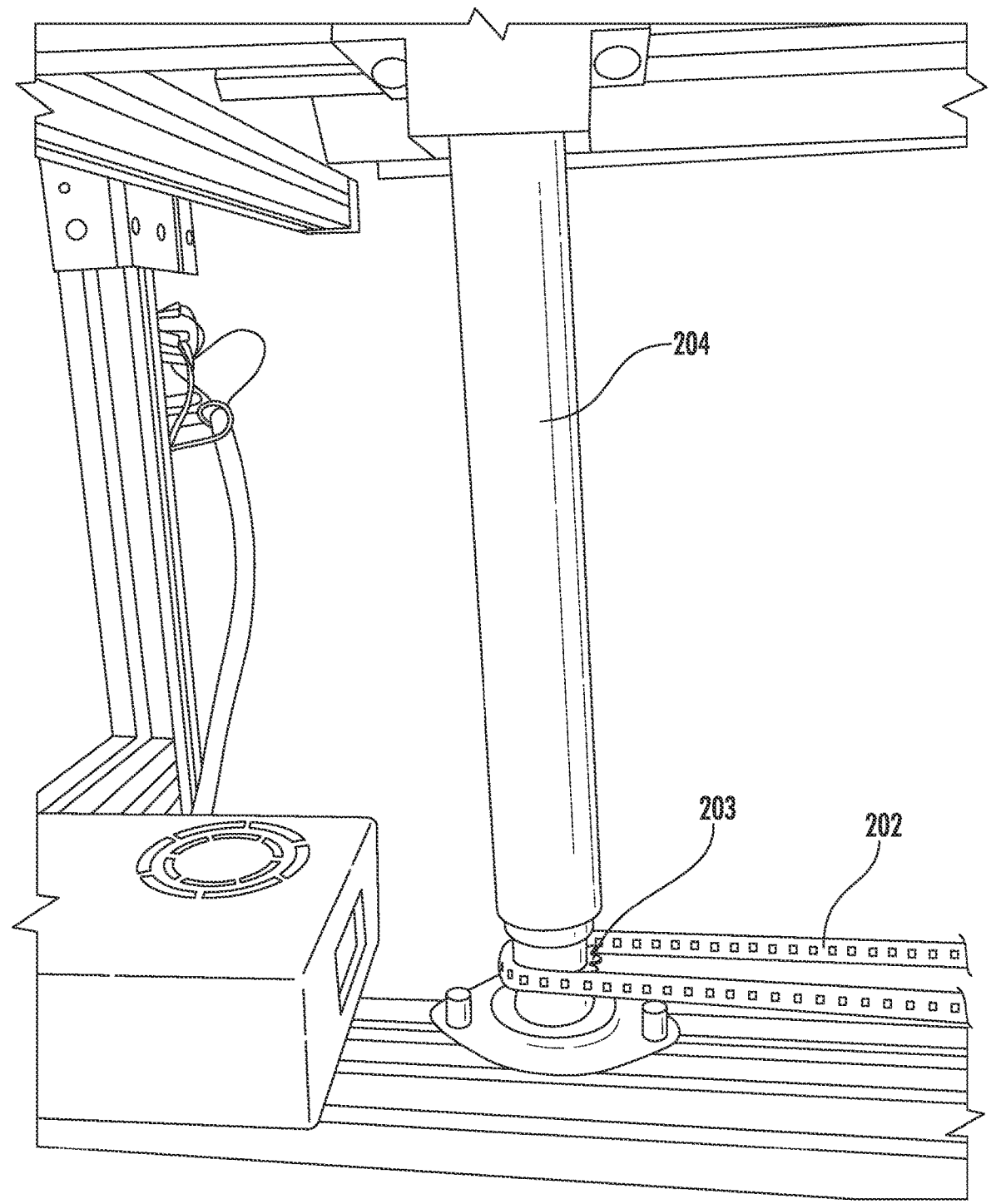
FIG. 4 is a perspective view of a portion of a mechanism for changing the vertical position of the moveable table assembly of the adaptive manufacturing table of FIG. 1.

As shown in FIGS. 1-4, in some embodiments, the adaptive manufacturing table 100 may include two mechanisms for moving the table assembly 400. The first mechanism is configured to move movable planar assembly in the vertical direction. Motor 201 is configured to turn flexible member 202 which in turn initiates vertical movement in actuator 204 (see FIG. 4). The configuration in FIGS. 1 and 2 includes two flexible members 202 and two actuators 204; however, any number of flexible members 202 and actuators 204 may be used (including only one of each). In addition, in some embodiments, the motor 201 may be located immediately adjacent to the actuator 204 to eliminate the need for flexible member 202 (e.g., a gear train may be utilized). Flexible member 202 may be a belt, a chain, a rope, or any flexible object for translating motion from the motor 201 to the actuator 204. FIG. 4 shows a sprocket 203 at the interface between flexible member 202 and actuator 204. However, sprocket 203 may not be necessary (e.g., when flexible member 202 is a belt).

The movement of actuator 204 relocates movable planar assembly in the vertical direction where (as described above) the movable planar assembly comprises right edge member 116, right partial member 116a, left edge member 117, left partial member 117a, intermediate horizontal member 122, and rear horizontal member 123. The movable planar assembly moves as sliding fittings 148, 149, 150, and 151 move along the surface of rear right member 112, rear left member 113, front right member 114, and front left member 115, respectively. Because sliding brackets 140 and 141 can slide along rear right member 112 and rear left member 113, respectively, the movement of actuator 204 causes the entire moveable table assembly 400 to move in translation in the vertical direction (i.e., the angle of table surface 130 remains constant during movement of actuator 204).

The second mechanism is configured to rotate the moveable table assembly 400 about a horizontal axis. Motor 221 is configured to turn a flexible member 222, which in turn initiates vertical movement in an actuator 224 (see FIG. 2). The configuration in FIG. 2 includes two flexible members 222 and two actuators 224; however, any number of flexible members 222 and actuators 224 may be used (including only one of each). In addition, in some embodiments, the motor 221 may be located immediately adjacent to the actuator 224 to eliminate the need for flexible member 222 (e.g., a gear train may be utilized). Flexible member 222 may be a belt, a chain, a rope, or any flexible object for translating motion from the motor 221 to the actuator 224.

As shown in FIG. 2, motor 221 and actuators 224 are attached to beam 144, which includes three pivoting fittings 145, 146, and 147. Although three fittings are illustrated, any number of pivoting fittings may be used (including less than three or more than three). The three pivoting fittings 145, 146, and 147 are fastened to table frame 133 (in particular, to rear frame portion 133a). Each of the actuators 224 are attached to an anchor plate 225 such that beam 144 moves in a vertical direction due to motion of actuators 224. Because sliding brackets 140 and 141 can slide along rear right member 112 and rear left member 113, respectively, the movement of actuator 224 causes the rear section of the table assembly 400 to move in a vertical direction. To allow rotation of the table assembly, when beam 144 moves in a vertical direction, the front section of the table assembly is allowed to move in the forward/rear direction along right edge member 116 and left edge member 117 using sliding brackets 142 and 143, respectively. Accordingly, when beam 144 moves down, sliding brackets 140 and 141 slide down along rear right member 112 and rear left member 113 (respectively) and sliding brackets 142 and 143 slide forward (toward a user) along right edge member 116 and left edge member 117 (respectively) such that the table assembly 400 rotates to a flatter, more horizontal position. Conversely, when beam 144 moves up, sliding brackets 140 and 141 slide up along rear right member 112 and rear left member 113 (respectively) and sliding brackets 142 and 143 slide rearward (away from a user) along right edge member 116 and left edge member 117 (respectively) such that the table assembly 400 rotates to a steeper, more vertical position.

In some embodiments, as shown in FIG. 1, the adaptive manufacturing table 100 may include a control panel 180. The control panel 180 may be located on the adaptive manufacturing table 100 (as shown in FIG. 1) or may be located remotely.

In some embodiments, the moveable table assembly 400 may be configured to provide a range of positions between a first position where table surface 130 is disposed in an approximately horizontal position and a second position where the table surface 130 is disposed approximately 70 degrees from horizontal. In addition to changing the angle of table surface 130 (with respect to horizontal), as described above, the moveable table assembly 400 may be moved in the vertical direction. The combination of angle and height adjustments may be designed to accommodate a comprehensive range of potential users (e.g., a range from a $5^{th}$ percentile female to a $95^{th}$ percentile male). Moreover, the ability to change the position of the table (which can occur during manufacturing tasks because the projector does not require repositioning due to its static mounting to the moveable table assembly 400) has ergonomic benefits. In addition to repositioning the moveable table assembly 400 to ensure a proper working height, a user may periodically reposition the moveable table assembly 400 to reduce fatigue.

Automatic Cable Tie Device

The adaptive manufacturing table 100 may include an automatic cable tie device 170. As shown in FIGS. 1 and 2, an automatic cable tie device 170 may include a control box 175, a gun 171, a cord 172, a reel 173, and a mounting arm 174. The automatic cable tie device 170 may be operated via an electric mechanism, a pneumatic mechanism, or any other suitable mechanism. A user may utilize the automatic cable tie device 170 to increase efficiency and reduce the time needed for manufacturing tasks. In some embodiments, as shown in FIG. 1, the control box 175 may be located on the shelf surface 127.

Different arrangements of the components depicted in the drawings or described above, as well as components and steps not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications may be made without departing from the scope of the claims below.

That which is claimed is:

1. An adaptive manufacturing table comprising:
a structural frame assembly;
a moveable table assembly comprising a table surface and a table frame, wherein the moveable table assembly is mounted to the structural frame assembly and is slidable along a first axis and a second axis relative to the structural frame assembly, wherein the first axis and the second axis are non-parallel; and
a projector supported on a projector frame, wherein the projector frame is rigidly mounted to the moveable table assembly such that the projector moves with movement of the moveable table assembly,
wherein the table frame comprises a plurality of elongate members.

2. The adaptive manufacturing table of claim 1, wherein the projector is configured to directly project an image onto the table surface.

3. The adaptive manufacturing table of claim 1, further comprising at least one moving mechanism, wherein the at least one moving mechanism moves the moveable table assembly relative to the structural frame assembly.

4. The adaptive manufacturing table of claim 3, wherein the at least one moving mechanism comprises a motor and a chain drive mechanism.

5. The adaptive manufacturing table of claim 1, wherein the moveable table assembly is further configured to rotate relative to the structural frame assembly.

6. The adaptive manufacturing table of claim 5, wherein the moveable table assembly is configured to rotate about a third axis that is non-parallel to the first axis and the second axis.

7. The adaptive manufacturing table of claim 6, wherein the moveable table assembly is configured to rotate between a flat position at approximately 0 degrees to approximately 70 degrees relative to a horizontal axis.

8. The adaptive manufacturing table of claim 6, further comprising a moveable planar assembly disposed under the moveable table assembly wherein the moveable planar assembly is slidable along the first axis or the second axis.

9. The adaptive manufacturing table of claim 1, wherein the projector is a short throw projector.

10. The adaptive manufacturing table of claim 1, further comprising an automatic cable tie device.

11. The adaptive manufacturing table of claim 1, wherein the table surface comprises a plurality of holes.

12. The adaptive manufacturing table of claim 1, further comprising at least one hinge, and wherein the at least one hinge attaches the projector frame portion to the moveable table assembly.

13. The adaptive manufacturing table of claim 1, wherein the projector frame portion is attached to at least one of the plurality of elongate members.

14. The adaptive manufacturing table of claim 13, wherein the projector frame portion comprises a plurality of attachments to the plurality of elongate members.

15. The adaptive manufacturing table of claim 1, wherein the plurality of elongate members form a perimeter around the table surface.

16. An adaptive manufacturing table comprising:
a structural frame assembly;
a moveable table assembly comprising
a table surface, wherein the moveable table assembly is slidable along a first axis and a second axis relative to the structural frame assembly, wherein the first axis and the second axis are non-parallel; and
a projector supported on a projector frame, wherein the projector frame is rigidly mounted to the moveable table assembly such that the projector moves with movement of the moveable table assembly
wherein the projector is rotatably supported on the projector frame such that the projector is rotatable relative to the table surface.

17. The adaptive manufacturing table of claim 16, wherein the projector is configured to directly project an image onto the table surface.

18. The adaptive manufacturing table of claim 16, wherein the moveable table assembly is configured to rotate relative to the structural frame assembly.

19. The adaptive manufacturing table of claim 16, wherein the projector frame comprises a plurality of attachments to the plurality of elongate members, and wherein the plurality of elongate members form a perimeter around the table surface.

20. An adaptive manufacturing table comprising:
a structural frame assembly;
a moveable table assembly comprising a table surface, wherein the moveable table assembly is slidable along a first axis and a second axis relative to the structural frame assembly, wherein the first axis and the second axis are non-parallel; and
a projector supported on a projector frame, wherein the projector frame is rigidly mounted to the moveable table assembly such that the projector moves with movement of the moveable table assembly.

21. The adaptive manufacturing table of claim 20, wherein the projector is configured to directly project an image onto the table surface, and wherein the projector is rotatably attached to the projector frame such that the projector is rotatable relative to the table surface.

22. The adaptive manufacturing table of claim 20, wherein the moveable table assembly is further configured to rotate relative to the structural frame assembly.

23. The adaptive manufacturing table of claim 20, wherein the projector comprises a frame portion with a plurality of attachments to the plurality of elongate members, and wherein the plurality of elongate members form a perimeter around the table surface.

* * * * *